Figure 1:
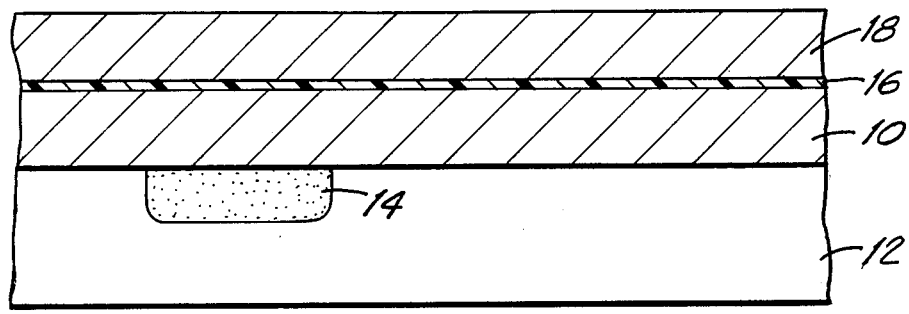

United States Patent [19]

Mo

[11] Patent Number: 4,764,484
[45] Date of Patent: Aug. 16, 1988

[54] METHOD FOR FABRICATING SELF-ALIGNED, CONFORMAL METALLIZATION OF SEMICONDUCTOR WAFER

[75] Inventor: Roy Mo, Flushing, N.Y.

[73] Assignee: Standard Microsystems Corporation, Hauppauge, N.Y.

[21] Appl. No.: 107,572

[22] Filed: Oct. 8, 1987

[51] Int. Cl.$^4$ .................. H01L 21/88; H01L 21/302
[52] U.S. Cl. ...................... 437/203; 437/201; 437/195; 437/192; 148/DIG. 106; 148/DIG. 20
[58] Field of Search ............... 437/192, 194, 195, 203, 437/189, 190, 200; 357/67, 71; 156/643; 148/DIG. 106, DIG. 20

[56] References Cited

U.S. PATENT DOCUMENTS

| | | | |
|---|---|---|---|
| 4,582,563 | 4/1986 | Hazuki et al. | 437/194 |
| 4,630,537 | 12/1986 | Rogers et al. | 437/200 |
| 4,707,218 | 11/1987 | Giammarco et al. | 156/643 |

FOREIGN PATENT DOCUMENTS

| | | | |
|---|---|---|---|
| 0224013 | 6/1987 | European Pat. Off. | 437/195 |
| 0022340 | 2/1985 | Japan | 437/195 |
| 0130825 | 7/1985 | Japan | 437/192 |

*Primary Examiner*—Brian E. Hearn
*Assistant Examiner*—T. N. Quach
*Attorney, Agent, or Firm*—Hopgood, Calimafde, Kalil, Blaustein & Judlowe

[57] ABSTRACT

A method is disclosed for fabricating a VLSI multilevel metallization integrated circuit in which a first dielectric layer (10), a thin silicon layer (16), and then a second dielectric layer (18) are deposited on the upper surface of a substrate. A trench (20) is formed in the upper, second dielectric layer leaving a thin layer of the second dielectric layer overlying the thin silicon layer. A contact hole (26) is then etched through the central part of the thin layer of the second dielectric layer, the thin silicon layer and the first dielectric layer to the surface of the substrate. Using the remaining outer portion (24a) of the thin layer of the dielectric layer as a mask over the underlying portion of the thin silicon layer, metal (28) such as tungsten is selectively deposited into the contact hole. The remaining portion of the thin layer of the second dielectric layer is then removed and the trench is selectively filled with a metal that is in electrical contact with the metal filling the contact hole.

11 Claims, 2 Drawing Sheets

METHOD FOR FABRICATING SELF-ALIGNED, CONFORMAL METALLIZATION OF SEMICONDUCTOR WAFER

The present invention relates generally to the fabrication of semiconductor integrated circuits, and more particularly to the fabrication of very large-scale integration (VLSI) circuits.

Recent developments in MOS VLSI integrated circuits have resulted in integrated circuits, capable of operating at higher speeds and characterized by reduced-size geometries and greater packing densities. This trend toward increasingly complex MOS devices has pushed the limits of existing materials and fabrication processes. As geometries have shrunk to one micron and less, circuit densities have increased, contact holes have become smaller, and line widths have become narrower. The resistance of the elements in the device structure increases along with the RC time constants, thereby limiting the overall speed of the device.

One proposed solution to this problem has been the use of refractory metals, such as tungsten and their silicides, as a high-conductive, low-resistance, and highly reliable interconnect material. The use of these materials provides an alternate to polysilicon for first-level interconnections and gate electrodes and an alternate to aluminum for multi-level interconnects, and a way of planarizing contacts and via holes without the need for troublesome sloped contact etching.

One of the most difficult areas in VLSI multilevel metallization technology is topography. Planarization of a certain amount is required to overcome the topography created by the underlying structures. The achievement of desired planarization, however, typically requires precise process control, increased process complexity, and a reduction in product yield.

In a conventional process used to fabricate a multilevel MOS integrated circuit, a dielectric layer is deposited on a surface of a substrate, a contact hole is formed in the dielectric, and a first metal layer is deposited and then etched. A second dielectric layer (interdielectric) is then deposited over the metal and a photoresist layer is deposited over the second dielectric layer. The structure is then subjected to a blanket etch back in an attempt to achieve planarization of the interdielectric. A via hole is then formed in the interdielectric to the upper level of the first metal layer. A second metal layer is then deposited and etched and extends through the via hole to contact the first metal layer. Thereafter, a passivation layer is deposited and etched.

There are, however, numerous problems associated with this conventional multilevel process, such as severe topography resulting in metal step coverage problems and residual metal problems, which may cause electrical opens for the interconnects and intralevel electrical shorts between adjacent interconnects. Other drawbacks associated with this conventional process include electromigration on narrow interconnects (particularly when aluminum is used), and the need for a metal overlap around the via and contact holes (dogbone structure) which results in the reduction of device packing density and in a degraded circuit performance.

It is an object of the invention to provide an improved process for fabricating a MOS integrated circuit in which planarization is reliably achieved.

It is a further object of the invention to provide a process for fabricating VLSI multilevel integrated circuits in which the planarization of the interdielectric layer and etching of the metal layer are eliminated.

It is another object of the invention to provide a process of the type described, which allows for the fabrication of more reliable VLSI integrated circuits and devices at high yield and at high packing densities.

It is yet a further object of the invention to provide a process of fabricating a VLSI structure in which self-alignment of the metallization layers is reliably achieved.

To these ends, in the process of the invention a first dielectric layer, a thin silicon layer, and then a second dielectric layer are deposited on the upper surface of a substrate. A trench is formed in the upper, second dielectric layer leaving a thin layer of the second dielectric layer overlying the thin silicon layer. A contact hole is then etched through the central part of the thin layer of the second dielectric layer, the underlying thin silicon layer, and the first dielectric layer to the surface of the substrate. Using the remaining outer portion of the thin layer of the dielectric layer as a mask over the underlying portion of the thin silicon layer, metal is selectively deposited into the contact hole. The remaining portion of the thin layer of the second dielectric layer is then removed and the trench is selectively filled with a metal which is in electrical contact with the metal previously deposited in the contact hole.

Figure 5:
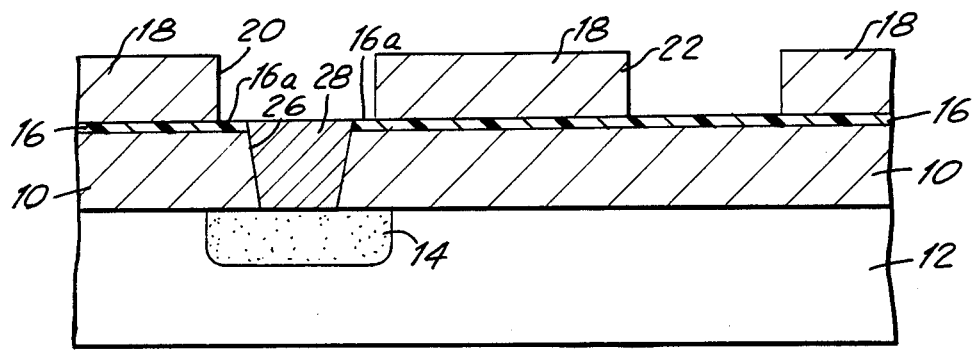
Figure 6:
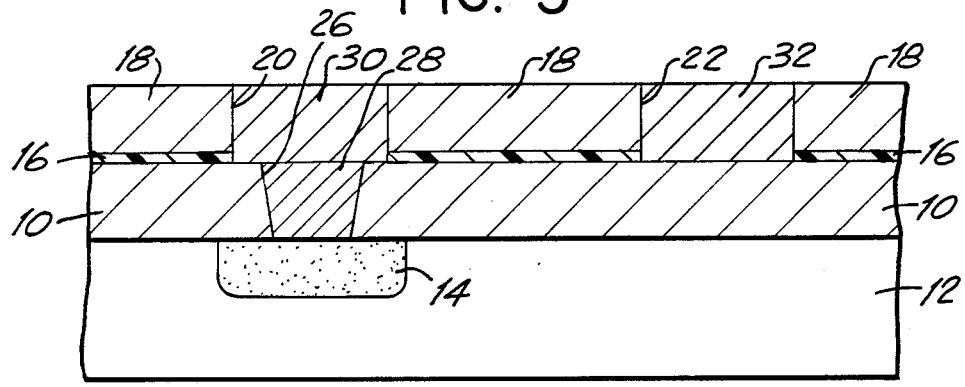
Figure 7:
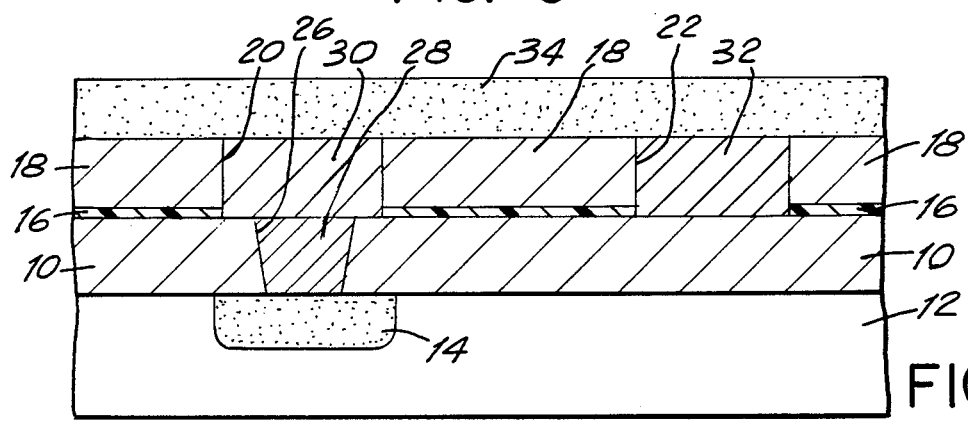
Figure 8:
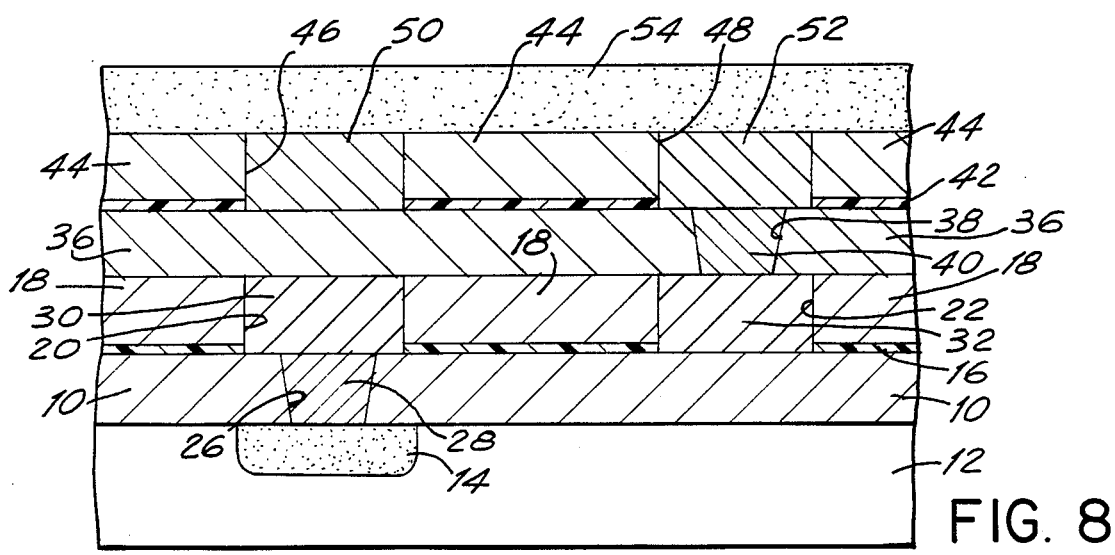

To the accomplishment of the above and such other objects as may hereinafter appear, the present invention is directed to a process for fabricating a VLSI MOS integrated circuit substantially as defined in the appended claims and as described in the following specification, as considered with the accompanying drawings in which:

FIGS. 1–7 are cross-sectional views of a VLSI integrated circuit shown during various stages of its fabrication in accordance with the process of the invention, FIG. 7 illustrating the completed integrated circuit structure; and FIG. 8 is a cross-sectional view similar to FIG. 7 illustrating a multilevel integrated circuit fabricated according to the process of the invention.

As shown in FIG. 1, in the process of the invention, a dielectric (silicon oxide) layer 10 of between 0.3 and 2.5 micron is deposited on a silicon substrate 12 in which, as is typical, a region 14 of an opposite conductivity to the substrate is formed such as by implantation or diffusion. A thin (50–2,500 A) layer 16 of silicon (e.g., polycrystalline silicon or amorphous silicon) is deposited over dielectric layer 10 and a second dielectric layer 18 of between 0.3 to 2.5 microns, which may be one of a silicon dioxide film, a silicon nitride film and an oxynitride film, is deposited over the silicon layer 16.

Figure 2:
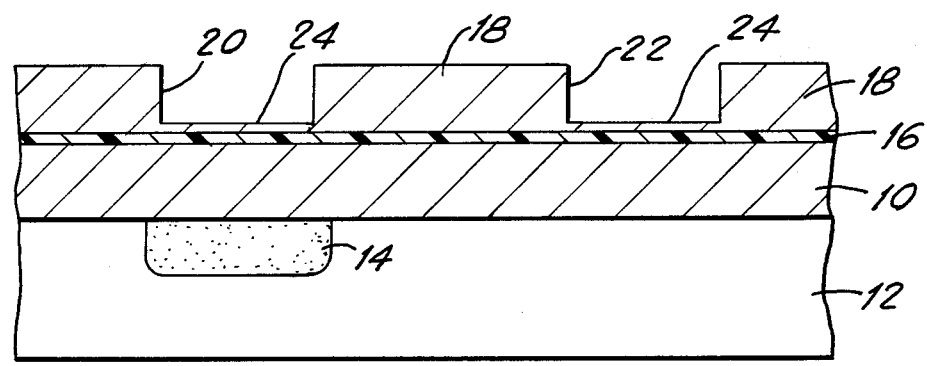

Thereafter, as shown in FIG. 2, by means of a per se conventional photolithography and timed etch operation, the latter being either a dry plasma or wet chemical etch, trenches 20, 22 of between 0.3 and 2.5 microns in depth are formed in the dielectric layer 18 leaving a thin (200–1,200 A) layer 24 of dielectric material at the bottom of the trenches and overlying the silicon layer 16. One of the trenches, here trench 20, as shown, overlies the region 14.

Figure 3:
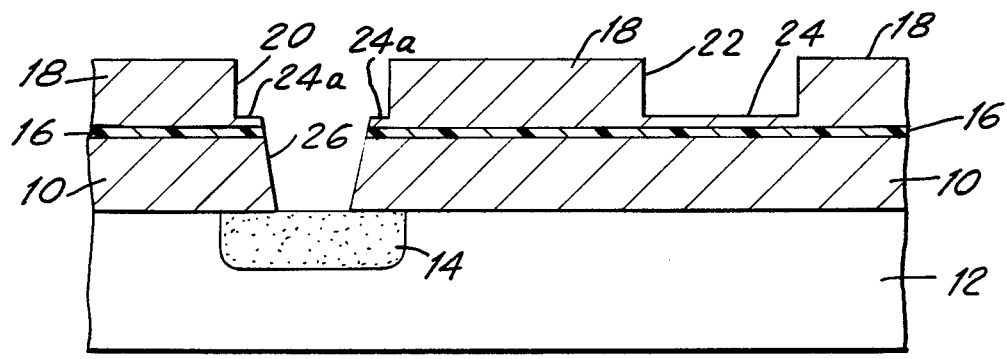

Thereafter a photolithography and etch (dry or wet etch) operation is performed to etch through the central portion of the thin dielectric layer 24 and the underlying portion of the thin silicon layer 16 and lower dielectric layer 10 to form a contact hole 26, as illustrated in FIG. 3. It will be noted that a portion 24a of the thin dielectric layer 24 remains over the thin silicon layer 16 at the upper end of the contact hole so formed.

Figure 4:
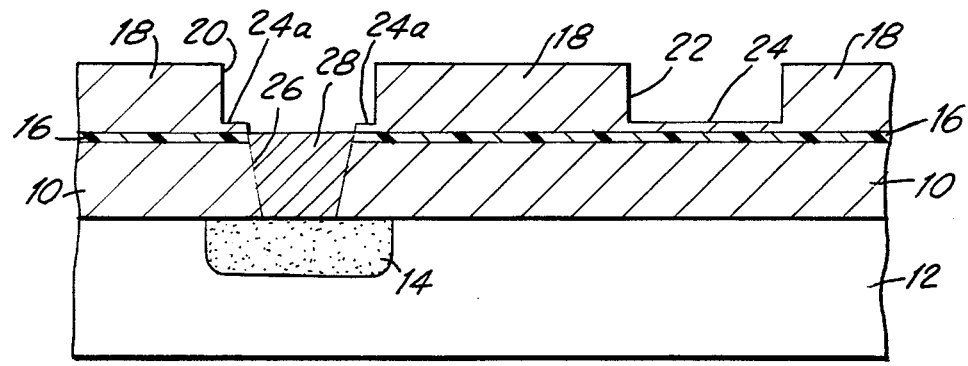

Then, as shown in FIG. 4, a chemical vapor deposition (CVD) procedure is carried to selectively deposit a metal 28 (e.g., tungsten) which will deposit selectively only onto a silicon surface at the bottom of the contact hole to an extent sufficient to fill up the contact hole 26. Because of the presence of the portion 24a of the thin dielectric layer 24 overlying the silicon film at the location of the contact hole, no metal (tungsten) will be deposited over the thin silicon layer at that location. Thereafter, as shown in FIG. 5, the remaining thin dielectric layer 24a is then removed either by a dry (plasma) or wet (chemical) etch, thereby to leave exposed a portion 16a of the thin silicon layer at the bottom of trenches 20 and 22.

Thereafter, as shown in FIG. 6, a metal 30, 32, such as tungsten, is selectively deposited by a CVD process to respectively fill trenches 20, 22. The exposed silicon 16a may either be completely or partially consumed during this procedure. The metal (tungsten) in trench 20 overlies and is aligned with and contacts the metal (tungsten) 28 in contact hole 26. Thereafter, in a single-level process, the structure of FIG. 6 is covered with a passivation layer 34, as shown in FIG. 7.

FIG. 8 illustrates the fabrication technique of FIGS. 1-7 extended to a multilevel metal process. The structure of FIG. 8 is fabricated by repeating the process steps illustrated in FIGS. 1-7 as described above, and corresponding portions of the structures in FIGS. 7 and 8 are designated by the same reference numerals. Thereafter, a third dielectric (e.g., silicon oxide) layer 36 of between 0.3 and 1.5 microns, a thin silicon layer 42 of between 50 and 2,500 A, and a fourth dielectric layer 44 of between 0.3 and 1.5 microns are deposited. Trenches 46 and 48 are formed in the upper-fourth dielectric layer 44 leaving a thin layer of the fourth dielectric layer overlying the thin silicon layer 42. The third dielectric layer 36 is then patterned and etched to form a via hole 38, which overlies and communicates with the upper surface of the trench 22. The via hole 38 is then filled with a metal 40, e.g., tungsten, by a selective deposition process, in a manner similar to that described above.

Thereafter, the remaining thin layers of the fourth dielectric layer 44 are removed, and an interconnect deposition step, as illustrated in FIG. 6, is carried out to selectively deposit tungsten 50, 52 into the trenches 46, 48, respectively, the latter being in electrical conduct, with no interfacial contact resistance, with the tungsten metal 40 in via hole 38 and thereby with the metal 32 in trench 22. As before, a passivation layer 54 is deposited over the upper surface of the upper dielectric layer 44 and the metal-filled trenches 46, 48.

It will be appreciated from the foregoing description of preferred embodiments that the fabrication process of the invention substantially eliminates two significant and difficult operations in VLSI fabrication, namely the planarization of the dielectric layer and the metal etching. The conformed metallization achieved by the inventive process provides more reliable VLSI devices, and the self-aligned metallization achieved allows for higher packing density of VLSI devices because metal overlapping the contact and via holes is no longer required. It will also be appreciated that modifications may be made to the embodiments of the invention described without necessarily departing from the spirit and scope of the invention.

What is claimed is:

1. A process for fabricating an integrated circuit comprising the steps of providing a substrate; forming in sequence a first dielectric layer, a thin silicon layer, and a second dielectric layer over an upper surface of said substrate; forming at least one trench in said second dielectric leaving a remaining thin layer of said second dielectric layer overlying said thin silicon layer at the bottom of the trench so formed; etching through a portion of said remaining thin layer, said underlying thin silicon layer and said underlying first dielectric layer, thereby to form a contact hole extending to the upper surface of said substrate, a portion of said thin dielectric layer remaining over a portion of said thin silicon layer at the upper part of said contact hole; thereafter, utilizing said remaining portion of said thin dielectric layer as a mask, selectively depositing a metal into said contact hole; thereafter removing said remaining portion of said thin dielectric layer leaving said portion of said thin silicon layer exposed; and thereafter selectively depositing a second metal onto said exposed part of said thin silicon layer and the upper surface of said metal-filled contact hole, thereby to fill said trench with said second metal.

2. The process as defined in claim 1, in which the thickness of said remaining thin dielectric layer is between 200 and 1,200 Angstroms.

3. The process of claim 2, in which said first and second metals are each tungsten.

4. The process of claim 1, wherein said thin silicon layer comprises one of a polycrystalline silicon film and an amorphous silicon film.

5. The process of claim 1, in which said thin silicon layer is between 50 and 2,500 Angstroms in thickness.

6. The process of claim 1, in which said trench is between 0.3 and 2.5 microns in depth.

7. The process of claim 1, in which said metal is tungsten deposited selectively by means of chemical vapor deposition.

8. The process of claim 1, in which said dielectric layer comprises one of a silicon dioxide film, a silicon nitride film and a oxynitride film.

9. The process of claim 8, in which said dielectric layer is between 0.3 to 2.5 microns in thickness.

10. The process according to claim 1, wherein said substrate is semiconductor.

11. The process of claim 1, in which said thin silicon layer is between 50 and 2,500 Angstroms in thickness.

* * * * *